(12) United States Patent
Hornik et al.

(10) Patent No.: US 6,933,549 B2
(45) Date of Patent: Aug. 23, 2005

(54) BARRIER MATERIAL (75) Inventors: Karl Hornik, Kanagawa (JP); Koji Yamakawa, Tokyo (JP); Hiroshi Itokawa, Tokyo (JP)

(73) Assignees: Infineon Technologies Aktiengesellschaft, Munich (DE); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/248,896

(22) Filed: Feb. 28, 2003

(65) Prior Publication Data

US 2004/0169210 A1 Sep. 2, 2004

(51) Int. Cl.⁷ .............................................. H01L 29/76
(52) U.S. Cl. ............................. 257/295; 257/310; 438/3
(58) Field of Search ................................ 257/295, 310; 438/3

(56) References Cited

U.S. PATENT DOCUMENTS

| | | | |
|---|---|---|---|
| 6,249,014 B1 | 6/2001 | Bailey | 257/295 |
| 6,395,612 B1 | 5/2002 | Amanuma | 438/393 |
| 6,611,014 B1 | 8/2003 | Kanaya et al. | 257/295 |
| 6,630,702 B2 * | 10/2003 | Zhang et al. | 257/295 |
| 6,642,100 B2 * | 11/2003 | Yang et al. | 438/253 |
| 2001/0015430 A1 | 8/2001 | Hartner et al. | 257/1 |
| 2001/0034106 A1 | 10/2001 | Moise et al. | 438/396 |
| 2001/0044205 A1 | 11/2001 | Gilbert et al. | 438/653 |
| 2002/0195633 A1 | 12/2002 | Nagano et al. | 257/296 |

FOREIGN PATENT DOCUMENTS

JP   2001036026   2/2001

* cited by examiner

*Primary Examiner*—Sara Crane
(74) *Attorney, Agent, or Firm*—Horizon IP Pte Ltd.

(57) ABSTRACT

A barrier layer protecting, for example, a ferroelectric capacitor from hydrogen is described. The barrier layer comprises aluminum oxide with barrier enhancement dopants. The barrier enhancement dopants are selected from Ti, Hf, Zr, their oxides, or a combination thereof.

25 Claims, 8 Drawing Sheets

BARRIER MATERIAL

BACKGROUND OF INVENTION

Figure 1:
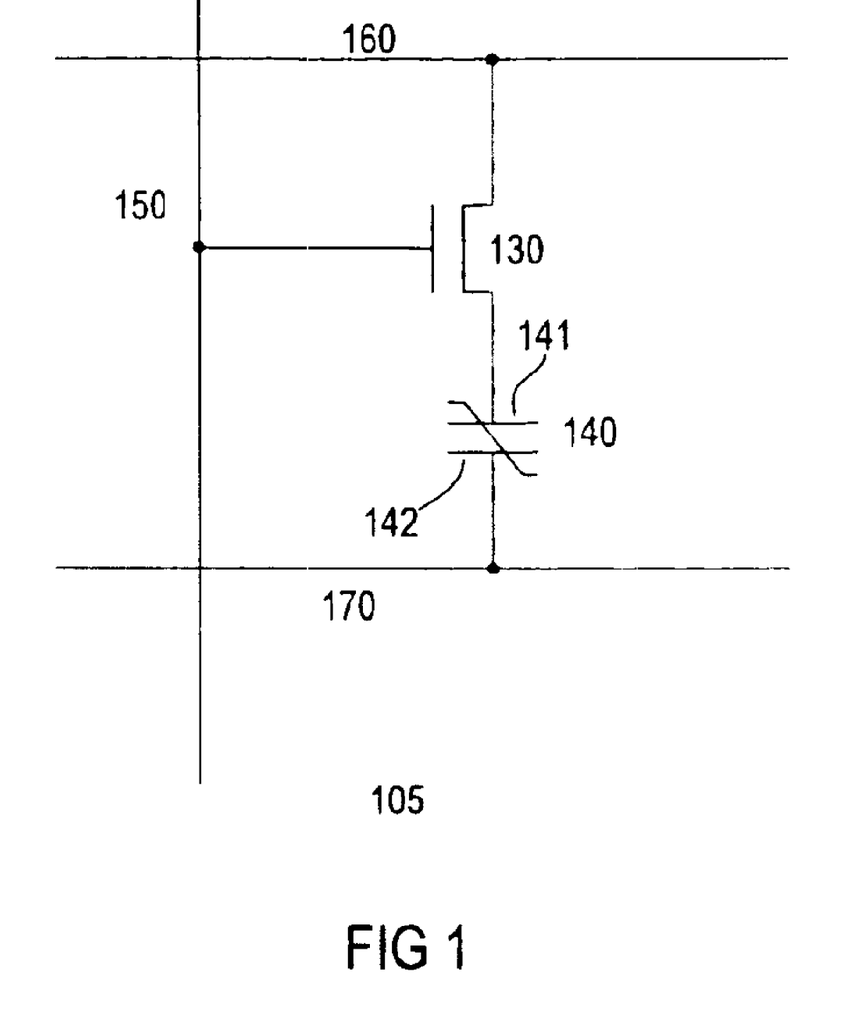
FIG. 1 shows a conventional ferroelectric memory cell.

Ferroelectric metal oxide ceramic materials such as lead zirconate titanate (PZT) have been investigated for use in ferroelectric semiconductor memory devices. Other ferroelectric materials, for example, strontium bismuth tantalate (SBT) can also be used. FIG. 1 shows a conventional ferroelectric memory cell 105 having a transistor 130 and a ferroelectric capacitor 140. An electrode 142 is coupled to a plateline 170 and another electrode 141 is coupled to the transistor which selectively couples or decouples the capacitor from a bitline 160, depending on the state (active or inactive) of a wordline 150 coupled to the transistor gate.

The ferroelectric memory stores information in the capacitor as remanent polarization. The logic value stored in the memory cell depends on the polarization of the ferroelectric capacitor. To change the polarization of the capacitor, a voltage which is greater than the switching voltage (coercive voltage) needs to be applied across its electrodes. An advantage of the ferroelectric capacitor is that it retains its polarization state after power is removed, resulting in a non-volatile memory cell.

Figure 2:
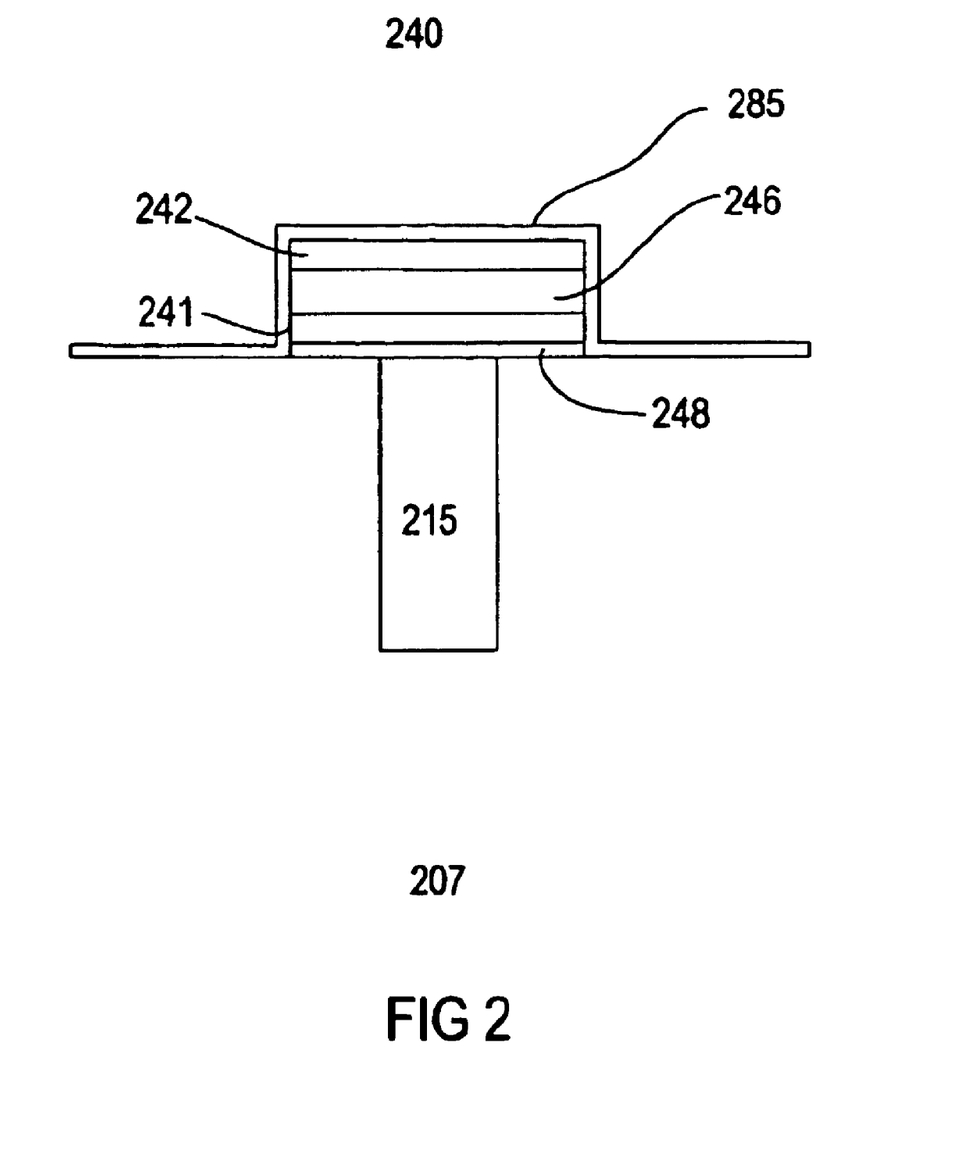
FIG. 2 shows a cross section of a conventional memory cell.

FIG. 2 shows a cross-section of a ferrolectric capacitor over plug COP structure 207. The structure comprises a capacitor 240 having a ferroelectric layer 246 disposed between bottom and top electrodes 241 and 242. A plug 215 is coupled to the bottom electrode. The plug is coupled to, for example, a diffusion region of a transistor, forming a memory cell. Typically, a barrier layer 248 is provided between the plug and the electrode of the capacitor to inhibit diffusion of oxygen which can oxidize the plug.

During, for example, back end processes such as intermetal dielectric (IMD) formation and passivation of gate oxide, hydrogen diffuse into the ferroelectric material as well as other materials of the capacitor. Hydrogen tends to pin the ferroelectric domains as well as decompose certain electrode materials, such as strontium ruthenium oxide (SRO). This degrades the performance or electrical characteristics of the capacitor. Conventionally, to protect the capacitor from hydrogen or atoms, an encapsulation layer 285 formed from silicon nitride, aluminum oxide ($Al_2O_3$), or titanium oxide ($TiO_2$) is provided over the capacitor. However, such conventional encapsulation materials have not been completely effective in protecting the capacitors from diffusion of hydrogen, thus reducing yields and reliability.

From the foregoing discussion, it is desirable to provide a material which can more effectively prevent the diffusion of hydrogen.

SUMMARY OF INVENTION

The invention relates to a barrier layer used in, for example, integrated circuits. The barrier layer protects a circuit feature from harmful elements such as hydrogen during processing. The circuit feature, in one embodiment, comprises a ferroelectric capacitor. The barrier layer covers at least a portion of the circuit feature. The barrier layer comprises aluminum oxide and barrier enhancing dopants. In one embodiment, the barrier enhancing dopants form a barrier enhancing layer. In one embodiment, the barrier layer comprises first and second aluminum oxide layer with the barrier enhancing layer located therebetween. The barrier enhancing dopants, in one embodiment, are selected from Ti, Zr, Hf, their oxides or a combination thereof.

DETAILED DESCRIPTION

The invention relates generally to barrier materials used in the fabrication of ICs. More particularly, the invention relates to barrier materials which inhibit the diffusion of hydrogen atoms. Such barrier materials are particularly useful for protecting ferroelectric capacitors against the deleterious effects of hydrogen atoms. The barrier material can also be used for protecting other types of device features from hydrogen or harmful elements such as oxygen.

Figure 3:
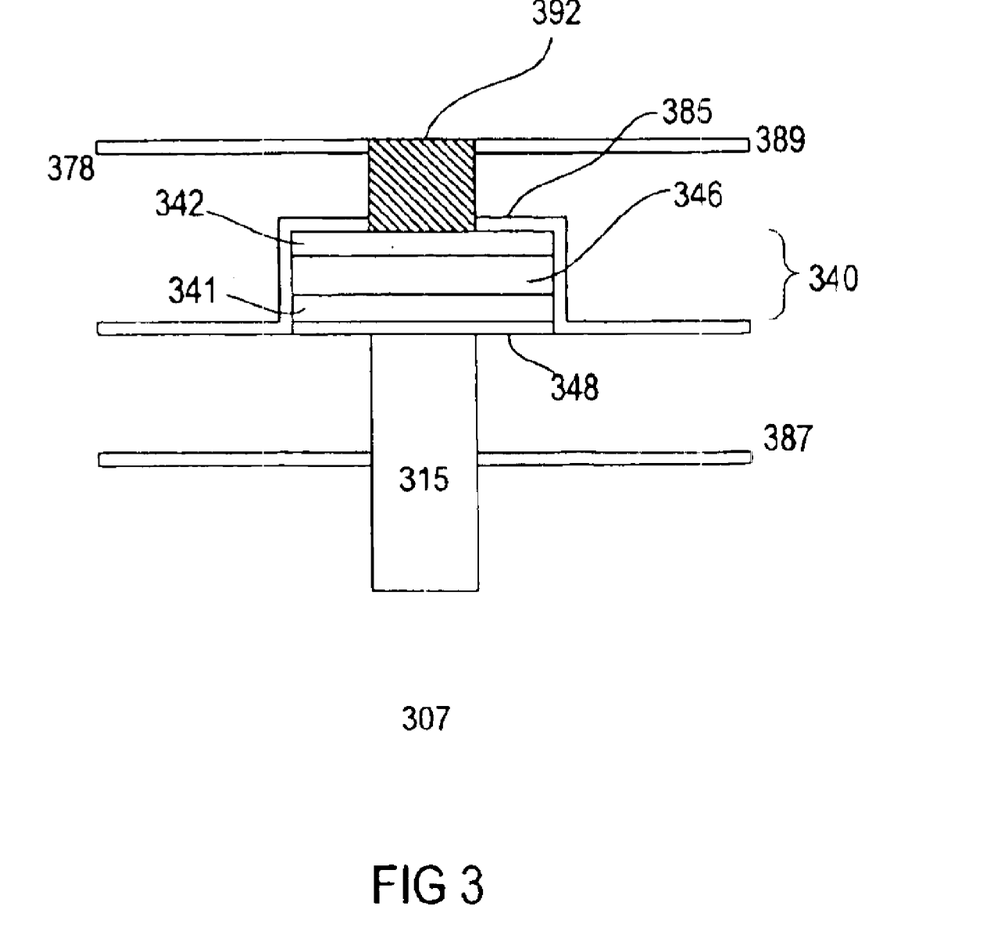
FIGS. 3–4 show various embodiments of the invention.

FIG. 3 shows a cross-section of a COP structure 307 in accordance with one embodiment of the invention. The COP structure comprises a capacitor 340 coupled to a plug 315. The capacitor comprises top and bottom electrode 342 and 341 separated by a dielectric layer 346. In one embodiment, the capacitor comprises a ferroelectric capacitor wherein the dielectric layer comprises a ferroelectric material such as PZT. Other types of ferroelectric materials, including SBT, are also useful. The electrodes can be formed from a noble metal such as platinum. Other types of conductive materials or conductive oxides, for example SRO or IRO, are also useful. Alternatively, other types of capacitors are also useful. For example, the capacitor can be a non-ferroelectric capacitor, such as a high k dielectric capacitor.

The plug couples the capacitor to, for example, a diffusion region of a transistor to form a memory cell. The plug, for example, comprises tungsten or poly-Si. Other types of conductive materials can also be used. The other diffusion region is coupled to a bitline via, for example, a bitline plug. The gate of the transistor serves as or is coupled to a wordline. The top plate of the capacitor, for example, is coupled to a plateline via a top electrode plug 392. A plurality of such memory cells are interconnected by bitlines, wordlines, and platelines to form a ferroelectric memory array. A dielectric layer 378 provides isolation between the capacitor and, for example, the plateline. The dielectric layer can be formed from silicon oxide. Other types of dielectric materials can also be used.

Alternatively, for a non-ferroelectric memory cell, the top plate of the capacitor is typically coupled to a reference voltage source. A plurality of memory cells are interconnected by wordlines and bitlines to form a non-ferroelectric memory array.

Various anneals in an oxygen ambient are required during the fabrication process to, for example, repair etch damage or to recover the properties of the ferroelectric layer. However, the oxygen can oxidize the plug. To prevent oxidation of the plug, a barrier layer 348 is provided between the plug and electrode of the capacitor. The barrier layer, for example, comprises a conductive material such as iridium. Other types of barrier materials can also be used.

Figure 4:
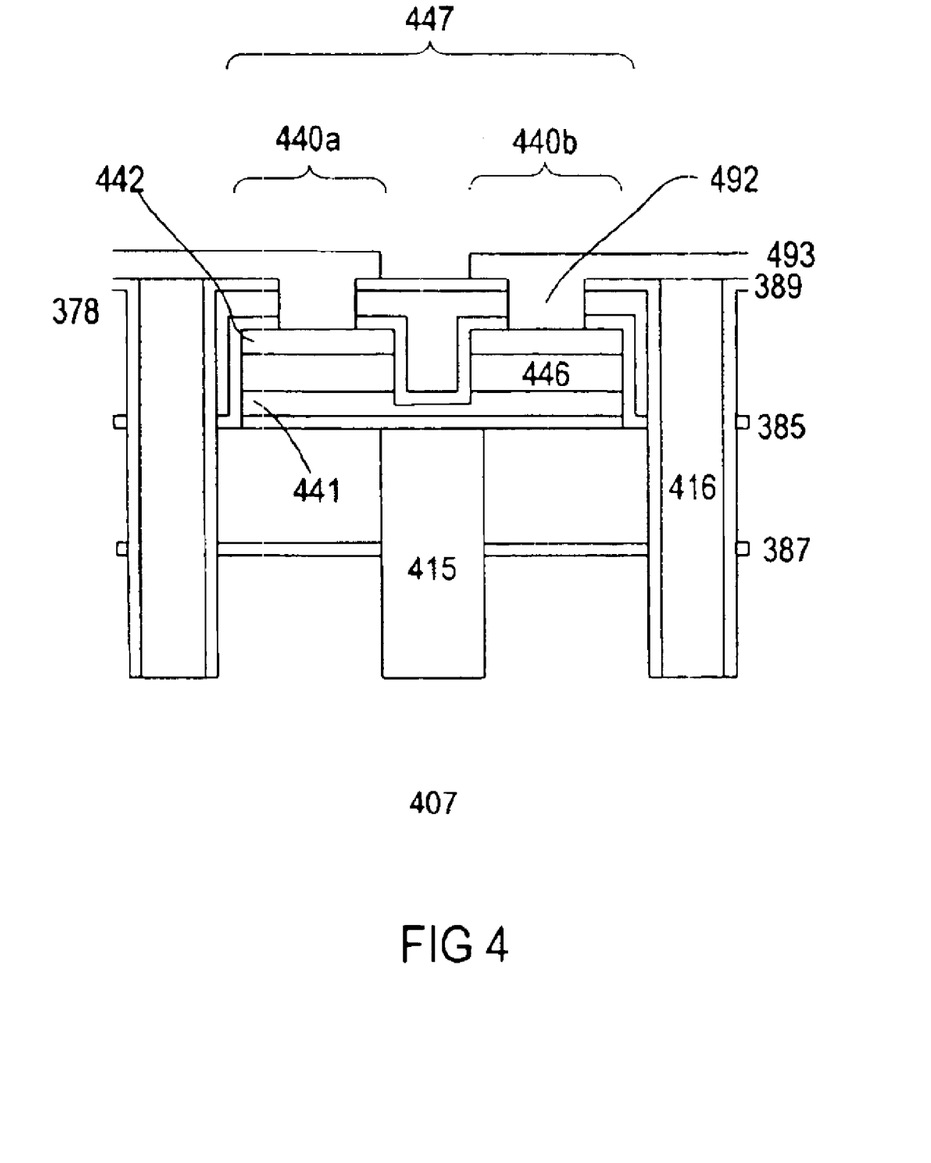

FIG. 4 shows a COP structure 407 in accordance with another embodiment of the invention. As shown, the COP structure comprises a pair of capacitors 447 coupled to a plug 415. The capacitor pair comprises first and second capacitors 440a-b. Such a capacitor pair is used in, for example, a series architecture. Series architectures are described in, for example, U.S. Pat. No. 5,903,492 "Semiconductor Memory Device and Various Systems Mounting Them", which is herein incorporated by reference for all purposes. In a series architecture, a group of memory cells, each with a capacitor coupled to a transistor in parallel, are coupled in series. One end of the group is coupled to a bitline and the other end is coupled to a plateline.

In one embodiment, adjacent transistors share a common diffusion region. The capacitors of the group are arranged in pairs. The pair of capacitors share a common bottom electrode 441. The top electrodes 442 of a capacitor pair are coupled to the top electrodes of adjacent capacitors of adjacent capacitor pairs. The top electrode of adjacent capacitors of adjacent capacitor pairs are also coupled to a common region shared by adjacent transistors of adjacent memory pairs. Where there is not an adjacent capacitor pair, the top electrode is coupled to the other diffusion region of the transistor. In one embodiment, the top electrode is coupled to the common diffusion region shared by an adjacent transistor of an adjacent memory cell pair via an active area top electrode (AATE) plug 416, top electrode plug 492, and strap 493.

In one embodiment, the capacitors of the pair are formed by a two step process. For example, the first process deposits and patterns the bottom electrode (including the barrier layer is applicable) followed by the deposition and patterning of the dielectric and top electrode. To ensure that the dielectric layer of the first and second capacitors are separated, an overetch can be performed. The overetch removes some bottom electrode material between the capacitors.

Referring to FIGS. 3–4, an encapsulation layer 385 is provided over the capacitor to protect the capacitor from, for example, hydrogen. In accordance with one embodiment of the invention, the encapsulation layer comprises aluminum oxide doped with a barrier enhancing dopant. In one embodiment, the barrier enhancing dopant comprises Ti, Zr, Hf or a combination thereof. Other types of dopants which enhance the barrier properties of the aluminum oxide layer are also useful.

In an alternative embodiment, the barrier layer comprises a barrier stack having first and second aluminum oxide layers separated by a barrier enhancing layer. The barrier enhancing layer comprises Ti, Hf, Zf or their oxides, or a combination thereof. Other materials which enhance the barrier properties of the first and second aluminum oxide layers are also useful.

A lower barrier layer 387 can be provided between the transistor and capacitor. The lower barrier layer prevents the penetration of, for example, hydrogen to the capacitor from beneath from a passivation anneal in hydrogen ambient to passivate the gate oxide.

Additionally, to provide additional protection to the capacitor, an upper barrier layer 389 can be formed on the IMD layer 378. The upper barrier layer provides protection to the capacitor from hydrogen during the passivation anneal to repair the damage to the gate oxide of the transistor. The AATE plug or BL plug can also be lined with a barrier layer.

Various types of materials can be used. For example, the barrier layer comprises silicon nitride, aluminum oxide, or titanium oxide. Preferably the barrier layer comprises aluminum oxide doped with a barrier enhancing dopant. The barrier enhancing dopant comprises, for example, Ti, Zr, Hf or a combination thereof. Other types of barrier enhancing dopants are also useful. Alternatively, the barrier layer comprises a barrier stack having first and second aluminum oxide layers separated by a barrier enhancing layer such as Ti, Zr, Hf, their oxides, or a combination thereof.

Figure 5:
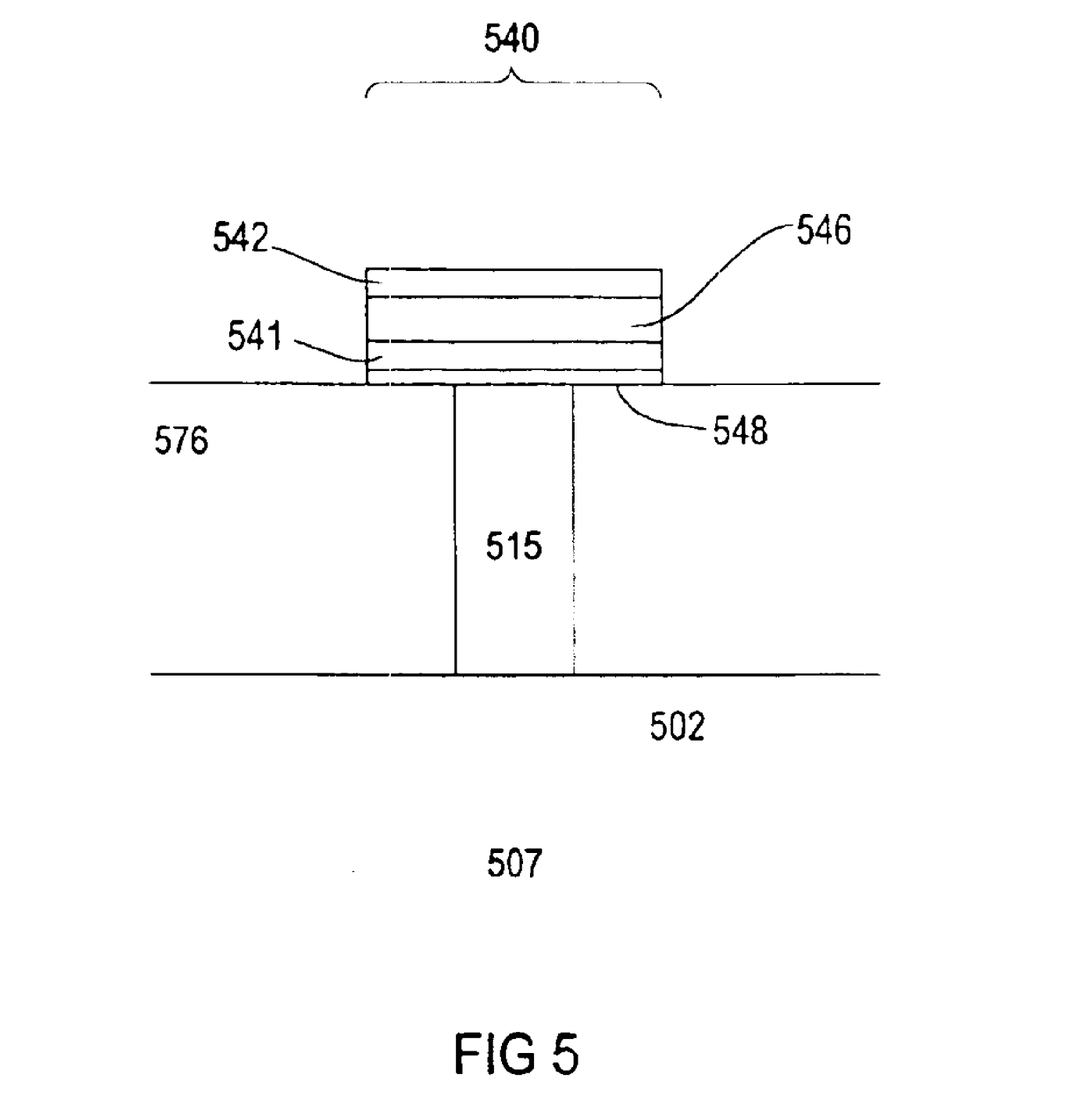
FIGS. 5–7 show a process for forming a capacitor in accordance with one embodiment of the invention.
Figure 6:
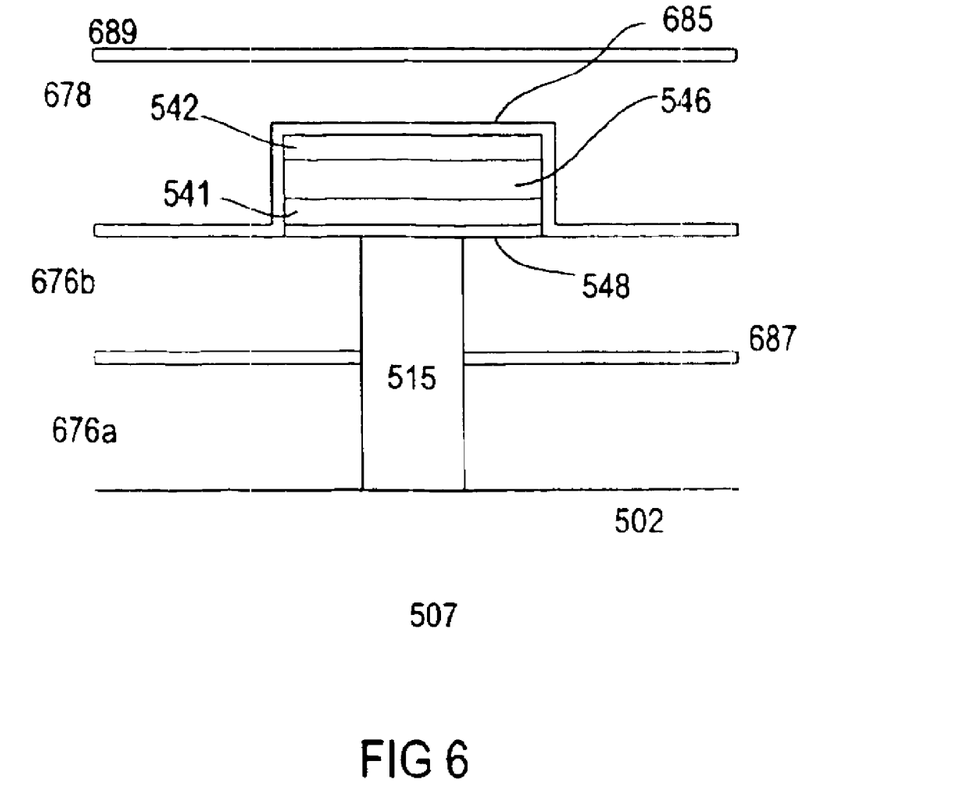
Figure 7:
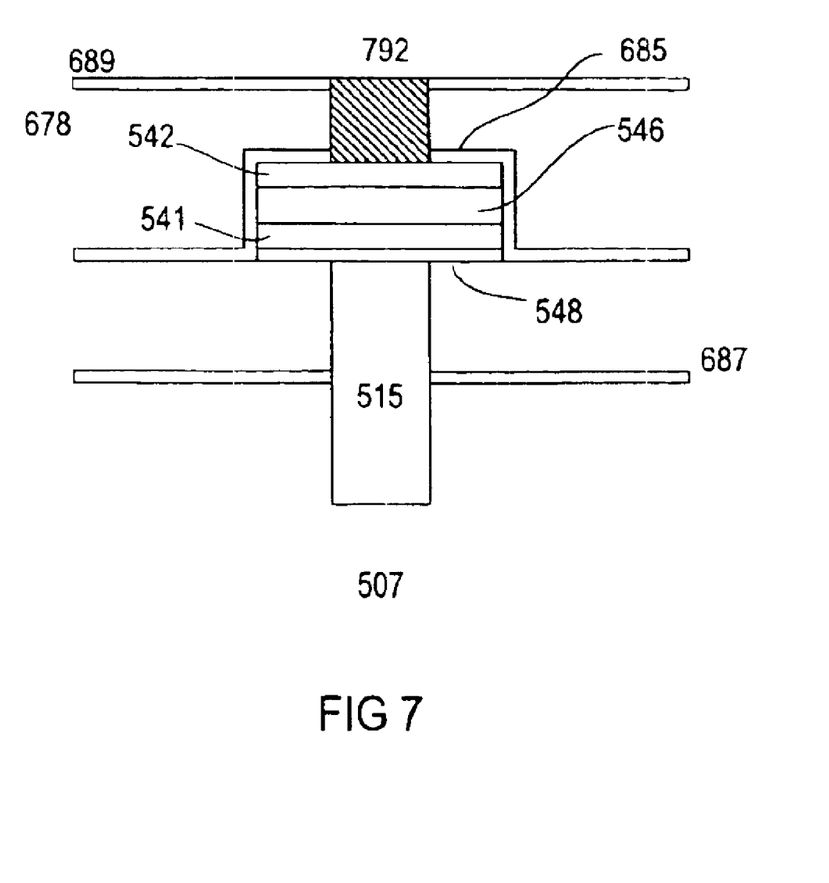

FIGS. 5–7 show a process for forming a COP structure 507 with improved barrier properties in accordance with one embodiment of the invention. The COP structure can be a part of a memory cell. Although only one COP structure is shown, it is understood that a plurality of COP structure can be formed to create a memory array of an IC, such as a memory IC. Other types of ICs are also useful.

In one embodiment, the COP structure comprises a capacitor 540 formed on a substrate. Alternatively, the COP structure comprises a pair of capacitor, such as those employed in series memory architectures. In one embodiment, the capacitor comprises a ferroelectric capacitor. Providing non-ferroelectric capacitors or other types of capacitors are also useful. The capacitor is coupled to, for example, a diffusion region of a transistor to form a memory cell.

The COP structure, in one embodiment, is formed using conventional techniques. For example, a semiconductor substrate 502 comprising, for example, silicon is provided. Other types of semiconductor substrates can also be used. The substrate can be prepared with a transistor having a gate and first and second diffusion regions. The gate, for example, is a gate conductor that interconnects to other memory cells. A dielectric layer 576, such as silicon dioxide ($SiO_2$), is deposited over the transistor. Other types of dielectric material, such as silicon nitride, spin-on glass (SOG), and doped or undoped silicate glass, are also useful. In one embodiment, the dielectric layer is deposited using conventional techniques. Such techniques include, for example, chemical vapor deposition (CVD) or spin-on.

A plug 515 is formed in the dielectric layer. The plug is coupled to, for example, one of the diffusion regions of the transistor. In one embodiment, the plug serves as the plug which couples the capacitor to the transistor. The plug can be formed using conventional techniques. Such techniques include, for example, etching a via (or contact opening) and filling it with conductive material. The conductive material comprises, for example, tungsten (W). Other types of conductive materials, such as doped poly-silicon, are also useful. The tungsten is deposited, in one embodiment, by sputtering or CVD. Other deposition techniques are also useful. Excess conductive material can be removed from the surface of the dielectric layer using a chemical mechanical polishing (CMP) process or can be etched back.

The process continues to form the capacitor. In one embodiment, the process continues to form a ferroelectric capacitor. An adhesion layer (not shown) and a barrier layer 548 can be deposited on the dielectric layer. The adhesion layer, for example, comprises titanium or other types of materials which promote adhesion between the dielectric layer and barrier layer. The barrier layer, in one embodiment, comprises iridium. Other barrier layers which prevent diffusion of oxygen are also useful.

Above the barrier layer, a first electrode layer 541 is deposited. The electrode material comprises, for example, a noble metal such as platinum. Other types of conductive materials, such as iridium, iridium oxide, ruthenium, ruthenium oxide or SRO, can also be used to form the electrode. Subsequently, a ferroelectric and second electrode layers 546 and 542 are deposited. The ferroelectric layer, in one embodiment, comprises PZT. Other ferroelectric materials are also useful. The various layers can be deposited using conventional techniques, such as sputtering CVD or spin-on. The various layers are then patterned to form the capacitor.

This, for example, can be achieved using a patterned hardmask and anisotropic etch, such as RIE.

Alternatively, the capacitor layers can be patterned in multiple processes. For example, ferroelectric layer and top electrode can be patterned first, followed by patterning of the bottom electrode. Such two step processes are useful for forming capacitor pairs, such as those used in series architectures. Also, the bottom electrode layer can be deposited and patterned followed by deposition and patterning of other layers of the capacitor.

Referring to FIG. 6, an encapsulation layer 685 is deposited over the capacitor. The encapsulation layer protects the capacitor from hydrogen. In one embodiment, the encapsulation layer comprises an aluminum oxide material doped with a barrier enhancing dopant. In one embodiment, the dopant comprises Ti, Zr, Hf, or a combination thereof. Other types of dopants which enhance the barrier properties of the aluminum oxide layer are also useful.

In one embodiment, the barrier layer is deposited by sputtering. Other deposition techniques such as ALD, CVD are also useful.

In an alternative embodiment, the encapsulation layer comprises a stack (sandwiched layer) having at least first and second aluminum oxide layer separated by a barrier enhancing layer. In one embodiment, the barrier enhancing layer comprises Ti, Zr, Hr, their oxides, or a combination thereof. In one embodiment, aluminum oxide layers are deposited by sputtering. Typically, the aluminum oxide layers are about 10 nm each. Other thicknesses are also useful. The barrier enhancing layer is deposited by, for example, ALD. Other techniques are also useful. The thickness of the barrier enhancing layer is about, for example, 25A. In one embodiment, the barrier enhancing layer is a Ti layer oxidized using an rapid thermal oxidation (RTO). The RTO is performed at, for example, 650° C. for about 30 seconds.

In one embodiment, to prevent hydrogen from penetrating to the capacitor from beneath, a lower barrier layer 687 can be provided between the capacitor and transistor. To form the lower barrier layer, a first dielectric layer 676a is deposited over the substrate, covering the transistor followed by forming the barrier layer thereover. The barrier layer comprises, for example aluminum oxide. Other types of barrier materials such as silicon nitride or titanium oxide, are also useful. Preferably, the barrier layer comprises aluminum oxide doped with a barrier enhancing dopant, such as Ti, Zr, Hf or a combination thereof. Alternatively, the barrier layer comprises a barrier stack having a barrier enhancing layer between first and second aluminum oxide layer. The barrier enhancing layer, in one embodiment, comprises Ti, Zr, Hf, their oxides, or a combination thereof. Thereafter, a second dielectric layer 676b is formed, followed by the formation of the plug.

In another embodiment, the BL or ATTE plug which is coupled to the second diffusion region of the transistor of the memory cell is formed in two separate processes. The first process forms a lower portion after the first dielectric layer is deposited. After the lower portion of the plug is formed (e.g., after CMP to remove excess plug material), the lower barrier layer is formed. The upper portion is formed by a second process after the capacitor is completed. The second dielectric layer is then deposited over the barrier layer, followed by the formation of plug 515.

After the encapsulation layer is formed, a third dielectric layer 678 is deposited to cover the capacitor. In one embodiment, the dielectric layer comprises $SiO_2$. Other dielectric materials are also useful. The dielectric layer is deposited using conventional techniques.

In one embodiment, an upper barrier layer 689 can deposit on the surface of the third dielectric layer. The barrier layer inhibits the penetration of hydrogen. In one embodiment, the barrier comprises silicon nitride, aluminum oxide, titanium oxide or other types of barrier materials. Preferably, the barrier layer comprises aluminum oxide doped with a barrier enhancing dopant, such as Ti, Zr, or Hf or a combination thereof. Alternatively, the barrier layer comprises a barrier stack having a barrier enhancing layer between first and second aluminum oxide layer. The barrier enhancing layer, in one embodiment, comprises Ti, Zr, Hf, their oxides, or a combination thereof.

Referring to FIG. 7, the process continues to form the interconnections to the top electrode and to the transistor (e.g., upper portion of the BL or AATE plug or to the diffusion region if the plug is formed in a single process step). In one embodiment, the plug to the transistor is first formed by forming a via. The via is formed, for example, etching the dielectric layer using a hard mask, such as polysilicon. Other types of masks can also be used.

To protect hydrogen from diffusing through the via to the capacitor, a barrier layer can be deposited on the substrate, lining the sidewalls of the via. In one embodiment, the barrier comprises silicon nitride, aluminum oxide, or other types of barrier materials. Preferably, the barrier layer comprises aluminum oxide doped with a barrier enhancing dopant, such as Ti, Zr, or Hf or a combination thereof. Alternatively, the barrier layer comprises a barrier stack having a barrier enhancing layer between first and second aluminum oxide layer. The barrier enhancing layer, in one embodiment, comprises Ti, Zr, Hf, their oxides, or a combination thereof. The barrier layer is anisotropically etched to expose the lower portion of the plug.

A conductive material is deposited on the substrate, filling the via. The conductive material comprises, for example, tungsten. Other types of conductive materials are also useful. Excess conductive material is removed from the surface of the hard mask by a polishing step, such as CMP. The hard mask is also removed, as part of the CMP process or as a separate etch step, using the barrier layer as a CMP or etch stop.

The TE contact 792 is then formed using conventional techniques. For example, the dielectric layer is etched to form the contact opening which is then filled with conductive material. Excess conductive material is removed by CMP.

Experiments

An experiment was conducted to compare the barrier properties of convention barriers versus barriers in accordance with various embodiments of the invention. Five samples were prepared. The samples include a ferroelectric capacitor structure comprising PZT. The first sample (case 1) includes a 20 nm aluminum oxide layer deposited over the capacitor structure by RF sputtering. The sputtering, was performed at room temperature using 50 sccm Ar sputter gas at 2.4 Pa. The remaining samples (cases 2–5) were covered with a barrier stack having first and second aluminum oxide layers separated by a titanium layer. For cases 4 and 5, the Ti layer was oxidized using a rapid thermal oxidation process (RTO) Table 1 shows the details of the barrier stacks for the remaining four samples.

TABLE 1

|  | 1st Al$_2$O$_3$ | Ti | Ti Treatment | 2nd Al$_2$O$_3$ | Post Deposition Treatment |
| --- | --- | --- | --- | --- | --- |
| Case 2 | 100 Å | 25 Å | None | 100 Å | None |
| Case 3 | 100 Å | 50 Å | None | 100 Å | None |
| Case 4 | 100 Å | 50 Å | RTP650 ° C.-30 s | 100 Å | None |
| Case 5 | 100 Å | 50 Å | RTP650 ° C.-30 s | 100 Å | RTP650 ° C.-30 s |

Figure 8:
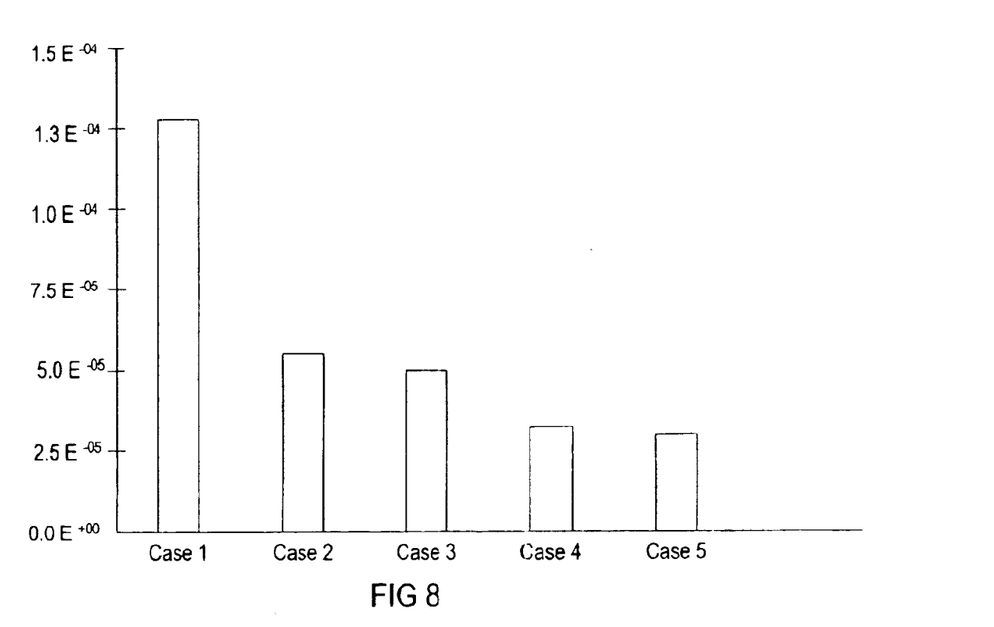
FIG. 8 shows experimental results of various barrier materials.

The samples were annealed for 30 minutes in H$_2$ atmosphere at 400° C. After the anneal, the H$_2$ content in the PZT layer of the samples was measured using SIMs which was normalized with respect to the oxygen content of the crystallized PZT layer. The results are shown in FIG. 8. The barriers of the present invention (cases 2–5) are more effective in inhibiting the diffusion of hydrogen than conventional barriers (case 1).

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit (IC) comprising:
   a circuit feature; and
   a barrier layer covering at least part of the circuit feature, the barrier layer comprising aluminum oxide and barrier enhancing dopants, wherein the barrier enhancing dopants comprises Zr or Hr or a combination thereof.

2. The IC of claim 1 wherein the circuit feature comprises a capacitor.

3. The IC of claim 1 wherein the circuit feature comprises a ferroelectric capacitor.

4. The IC of claim 1 wherein the barrier enhancing dopants form a barrier enhancing dopant layer.

5. An IC comprising:
   a circuit feature; and
   a barrier layer covering at least part of the circuit feature, wherein a barrier layer comprises first and second aluminum oxide layers and a barrier enhancing dopant layer located between them.

6. The IC of claim 5 wherein the circuit feature comprises a capacitor.

7. The IC of claim 5 wherein the circuit feature comprises a ferroelectric capacitor.

8. The IC of claim 5, 6 or 7 wherein the barrier enhancing dopant layer comprises Ti, Zr, or Hf, their oxides or a combination thereof.

9. An IC comprising:
   a circuit;
   a barrier layer covering at least part of the circuit feature, the barrier layer comprising aluminum oxide and barrier enhancing dopants;
   a first dielectric layer is located below the circuit feature;
   a second dielectric layer is located over the circuit feature; and
   a lower barrier layer below the circuit feature, wherein the lower barrier layer is located in the first dielectric layer, the lower barrier layer comprises aluminum oxide and barrier enhancing dopants.

10. The IC of claim 9 wherein the barrier enhancing dopants of the lower barrier layer form a barrier enhancing dopant layer.

11. The IC of claim 10 wherein the lower barrier layer comprises first and second aluminum oxide layers and the barrier enhancing dopant layer located between them.

12. The IC of claim 9 wherein the barrier enhancing dopants are selected froth Ti, Zr, Hf, their oxides or a combination thereof.

13. The IC of claim 12 wherein the barrier enhancing dopants of the lower barrier layer form a barrier enhancing dopant layer.

14. The IC of claim 13 wherein the lower barrier layer comprises first and second aluminum oxide layers and the barrier enhancing dopant layer located between them.

15. The IC of claim 9 further comprises:
   an upper barrier layer on the surface of the second dielectric layer.

16. The IC of claim 15 wherein the barrier enhancing dopants of the upper barrier layer form a barrier enhancing dopant layer.

17. The IC of claim 16 wherein the upper barrier layer comprises first and second aluminum oxide layers and the barrier enhancing dopant layer located between them.

18. The IC of claim 15 wherein the barrier enhancing dopants of the upper barrier layer are selected from Ti, Zr, Hf, their oxides or a combination thereof.

19. The IC of claim 18 wherein the barrier enhancing dopants of the upper barrier layer from a barrier enhancing dopant layer.

20. The IC of claim 19 wherein the upper barrier layer comprises first and second aluminum oxide layers and the barrier enhancing dopant layer located between them.

21. The IC of claim 4 wherein the barrier layer comprises first and second aluminum oxide layers and the barrier enhancing dopant layer beat between them.

22. The IC of claim 21 wherein the barrier enhancing dopant layer comprises barrier enhancing dopants or oxides thereof.

23. The IC of claim 22 wherein the barrier layer comprises first and second aluminum oxide layers and the barrier enhancing dopant layer located between them.

24. A method of forming an IC comprising:
   providing a substrate having a circuit feature formed thereon;
   forming a barrier layer on the substrate, the barrier layer covers at least a portion of the circuit feature, wherein forming the barrier layer comprises forming a barrier stack comprising first and second aluminum oxide layers separated by a barrier enhancing dopant layer.

25. A method of forming an IC comprising:
   providing a substrate having a circuit feature formed thereon;
   forming a barrier layer on the substrate, the barrier layer covers at least a portion of the circuit feature, wherein forming the barrier layer comprises forming an aluminum oxide layer doped with barrier enhancing dopants comprising Hf or Zr or a combination thereof.

* * * * *